United States Patent [19]

Hess et al.

[11] 4,145,706
[45] Mar. 20, 1979

[54] VIDEO DISPLAY

[75] Inventors: Heinz Hess, Weiterstadt; Horst Peth, Alsbach, both of Fed. Rep. of Germany

[73] Assignee: Robert Bosch GmbH, Stuttgart, Fed. Rep. of Germany

[21] Appl. No.: 826,462

[22] Filed: Aug. 22, 1977

[30] Foreign Application Priority Data

Aug. 28, 1976 [DE] Fed. Rep. of Germany ....... 2638858

[51] Int. Cl.² ............... H04N 9/62; H04N 7/02; H04N 7/18; G01R 13/22
[52] U.S. Cl. .................. 358/10; 324/77 R; 324/88; 358/139
[58] Field of Search ............ 358/139, 10; 324/77 R, 324/88

[56] References Cited

U.S. PATENT DOCUMENTS

| 3,337,684 | 8/1967 | Sadler | 358/139 |
| 3,787,618 | 1/1974 | Cook | 358/139 |
| 3,958,269 | 5/1976 | Davis | 324/88 |
| 4,058,826 | 11/1977 | Schneider | 358/139 |

Primary Examiner—Howard W. Britton
Attorney, Agent, or Firm—Michael J. Striker

[57] ABSTRACT

This invention concerns a circuit arrangement for visually representing a horizontal frequency coupled input signal on the picture screen of a video display device such as a domestic television receiver. This is achieved by comparing the input signal to be represented in visual form with a vertical frequency sawtooth signal, the comparison being effected in such manner that a further signal is produced which identifies the moments when the two compared signals are equal. The further signal is then used directly or indirectly to control the brightness of the picture screen of the video display device.

The further signal may be a pulse form signal with the leading flanks of the pulses corresponding to moments when the input signal crosses the sawtooth signal upwardly and the trailing flanks corresponding to the moments when the input signal crosses the sawtooth signal downwardly. The further signal is preferably differentiated prior to application to the display device.

13 Claims, 5 Drawing Figures

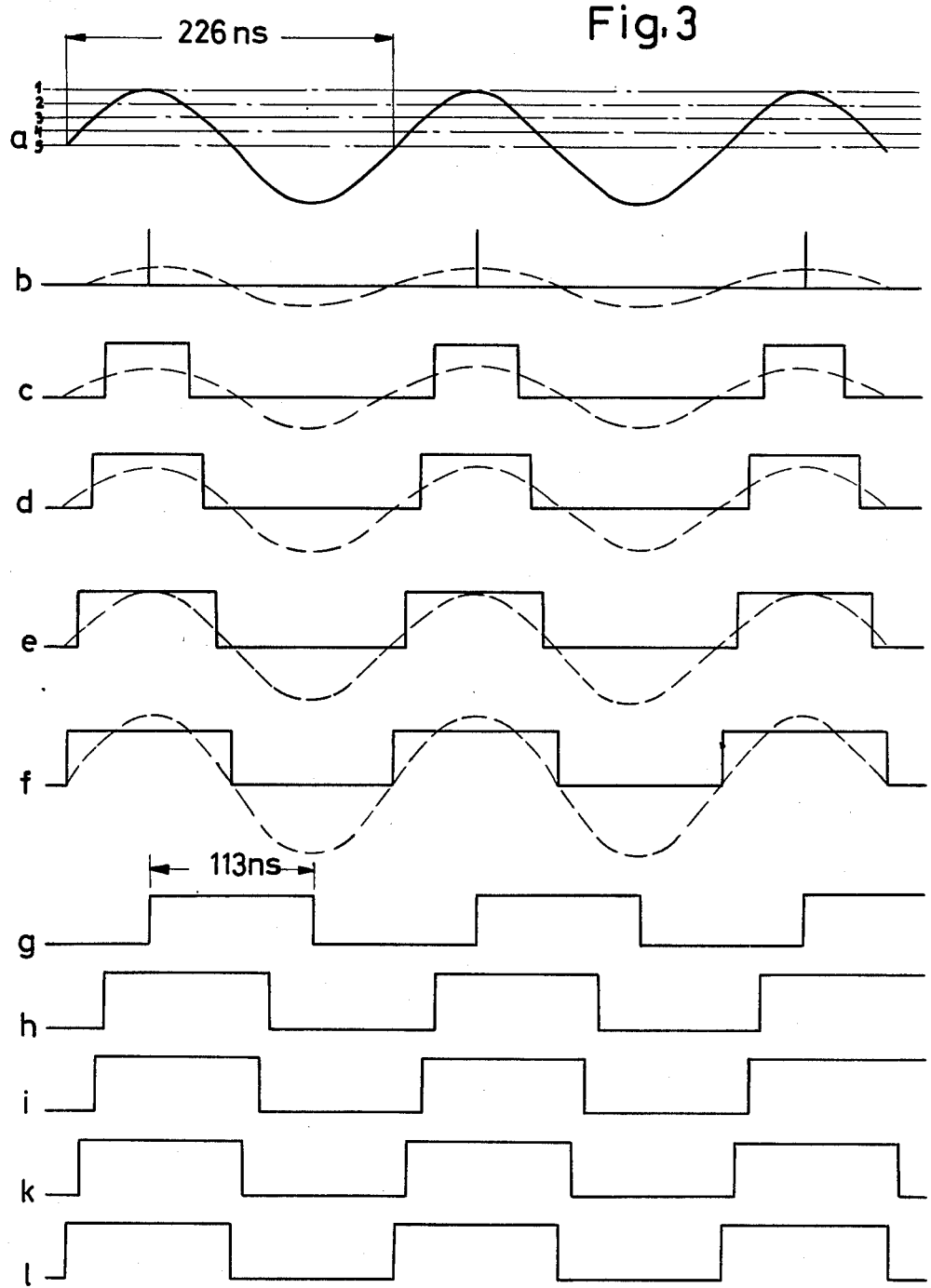

VIDEO DISPLAY

BACKGROUND OF THE INVENTION

This invention relates to a circuit arrangement for visually representing a horizontal frequency coupled signal on the picture screen of a video display device.

In the periodical "Elektor", December 1971, pages 1234 to 1242, there is disclosed an arrangement for the visual representation of a periodic signal which employs the picture tube of a domestic television receiver scanned according to the picture raster technique. In this arrangement a horizontal frequency sawtooth signal is, by means of a comparator, compared with the signal to be visually represented. When voltage parity of the two signals occurs the electron beam of the picture tube is unblanked. However, in this mode of operation the displayed voltage curve representing the periodic signal is rotated through 90°, that is to say it is disposed with a vertical time axis. In this known arrangement a further disadvantage is that only signals having a frequency less than the horizontal scanning frequency of the domestic television receiver can be reproduced.

SUMMARY OF THE INVENTION

Accordingly, it is an object of the invention to provide a circuit arrangement for the visual representation of a periodic signal in which the frequency of the periodic signal to be represented need not be less than the horizontal frequency of the receiver, and in which the displayed curve has a horizontal time axis.

According to the present invention there is provided a circuit arrangement for visually representing a horizontal frequency coupled input signal upon the picture screen of a video display device, comprising means for generating a vertical frequency sawtooth signal, means for comparing the input signal with the sawtooth signal so as to produce as output a further signal identifying the moments when the input and sawtooth signals are equal, and a video display device coupled to the output of the comparing means in such manner that the brightness of the picture screen of the display device is controlled by the further signal.

Using the invention it is possible to represent horizontal periods of a video signal in a horizontal position upon the picture screen of a normal video display device. The frequency resolution of the horizontal periods of the video signal corresponds to the horizontal resolution of the picture reproduction tube (ca. 5Mhz). Consequently it is also possible to render visible the oscillations of colour carrier frequency in a colour video signal.

It is also possible, in addition to level representation, to achieve reproduction with colour tone fidelity of the colour carrier information in the colour video signal. Furthermore it is also possible to carry out comparative measurements, e.g. by the use of superimposed level indication lines.

An embodiment of the invention, illustrating the foregoing and other objects, features and advantages of the invention, will now be described with reference to the accompanying drawings.

BRIEF DESCRIPTION OF THE DRAWINGS

FIG. 2 and FIG. 3 are voltage-time diagrams useful in explaining the operation of the above arrangement;

PREFERRED EMBODIMENT OF THE PRESENT INVENTION

Figure 1:
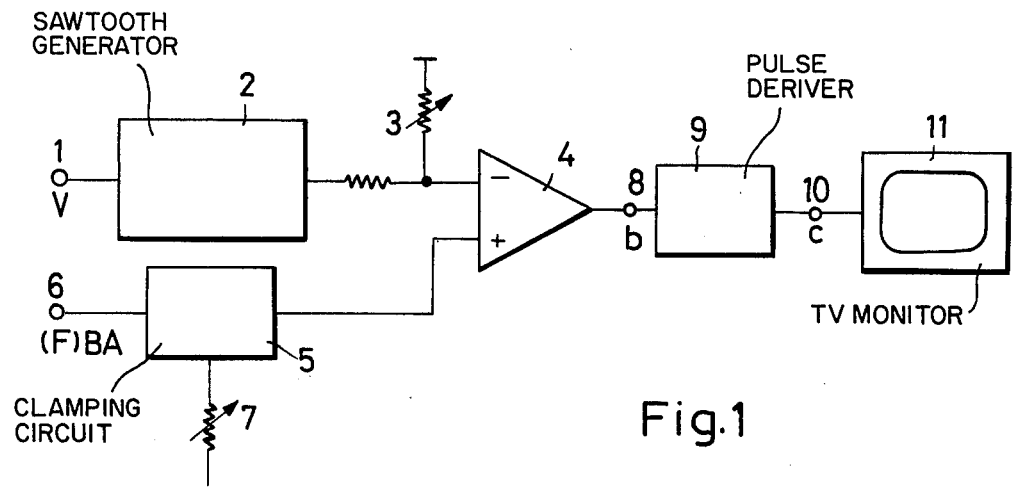
FIG. 1 is a block schematic diagram of an embodiment of a circuit arrangement according to the invention.

In the present practical example only those components which are necessary for performing and understanding the invention have been shown in the drawings. In the figures of the drawings equivalent components are provided with like reference characters.

In the block schematic diagram of FIG. 1, a vertical synchronizing signal V applied at a terminal 1 is converted by means of a sawtooth generator 2 into a vertical frequency sawtooth signal which, via an adjustable voltage divider 3, is delivered to the inverse input of a voltage comparator 4. An input video signal BA (monochromatic) or FBA (colour) which is to be visually represented is applied at terminal 6, clamped by means of a clamping circuit 5, and applied to the non-inverse input of the comparator 4. The clamping circuit 5 is advantageously designed so that the direct voltage value or component of the video signal (F) BA can be adjusted to a desired value by suitable selection of the clamping potential by means of an adjusting element such as the variable resistor 7. At the output terminal 8 of the comparator 4 there is connected a stage 9 which serves to derive (in a manner to be described) a pulse form signal which is delivered through a terminal 10 to the picture reproduction tube of a video display device such as the television monitor 11, where the pulse form signal influences the beam current and consequently the brightness of the picture tube.

The voltage divider 3 adjusts the amplitude, and the adjusting element 7 of the clamping stage 5 controls the position, of the voltage curve which is thereby displayed upon the picture screen and which represents the video signal applied at terminal 6. Instead of using the clamping stage 5, other arrangements may alternatively be employed for positional displacement of the voltage curve displayed upon the picture screen. For example, in one such alternative arrangement the video signal (F) BA applied to the terminal 7 is delivered via a coupling condenser to the non-inverse input of the comparator 4, and between the coupling condenser and the non-inverse input of the comparator 4 a unidirectional voltage, which is obtained from a potentiometer, is additively admixed with the video signal by way of a de-coupling resistance.

Figure 2:
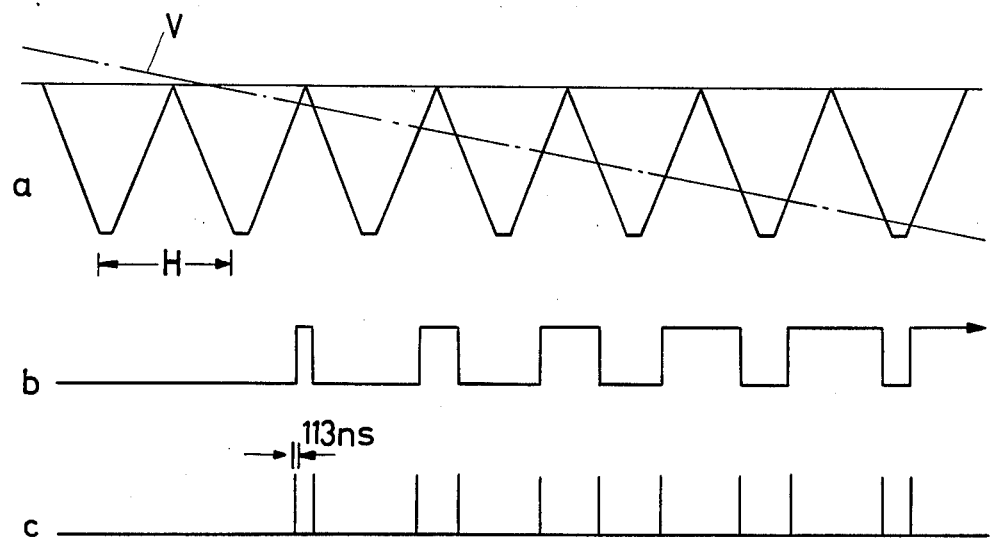

In explaining the operation of the block schematic diagram of FIG. 1 it will be assumed that at the non-inverse input of the comparator 4 there is applied the BA video signal shown in full lines in FIG. 2a whose curve form is triangular during the horizontal periods H. At the inverse input of the comparator 4 there is applied the vertical frequency sawtooth signal V, of which a small portion is shown in dashed lines in FIG. 2a. Under the voltage conditions assumed to exist in FIG. 2a, there is produced at the output terminal 8 of the comparator 4 the pulse form signal shown in FIG. 2b. It is seen that the output of the comparator 4 is always positive when the signal at the non-inverse input is more positive than at the the inverse input. In the pulse form signal of FIG. 2b the leading and trailing flanks of the individual pulses of the signal identify the moments when the input and sawtooth signals are equal. If the electron beam of the picture tube of the monitor 11 were to be gated directly with the pulse form signal of FIG. 2b there would be seen upon the picture screen the silhouette of a triangle.

For the purpose of converting the silhouette into a voltage curve of line form, however, the pulse form signal of FIG. 2b, which is available at the output of the comparator 4 at terminal 8, is differentiated in the circuit 9 which in its simplest form can consist merely of a differentiating circuit such as that shown at 14 in FIG. 4 which will be described later. The differentiation detects the leading and trailing flanks in the pulse form signal of FIG. 2b. Only upon the occurrence of a leading flank or trailing flank in the pulse form signal is the picture screen of the monitor 11 brightened, whereby the desired line image is formed.

We have found, however, that in the case where the signals to be represented are not of rectangular shape, differentiation alone results in phase errors. These phase errors appear as a particular disturbing phenomenon in the reproduction of the sinusoidal colour carrier of a colour video signal. When representing colour video signals upon the picture screen of a colour monitor the phase error has the effect of varying the colour saturation.

In the following the presence of the above mentioned phase errors will be explained with reference to FIG. 3 in the case of the sinusoidal oscillation of a PAL colour carrier. In FIG. 3a the full line represents several periods of a colour carrier oscillation. In the PAL colour television system the time period of a sinusoidal colour carrier oscillation amounts to 226 ns. The dash and dot lines in FIG. 3a are intended to represent the voltage level at various time instants (or, more accurately, very short time intervals) of the slope of the vertical frequency sawtooth signal. At time instant 1 of FIG. 2a the needle shaped pulses of FIG. 3b are produced at the output of the comparator 4. At time instant 2 there is produced the pulse form signal of FIG. 3c. By working further down the positive crest of the sinusoidal colour carrier oscillation of FIG. 3a, there are obtained for the time instants 3, 4 and 5 pulse form signals of increasing width (FIGS. 3d, e, f respectively). Differentiation of the pulse form signals thus obtained would lead to phase errors each depending upon the particular portion of the crest which is being operated on; i.e. the phase error depends upon how far up or down the crest the latter is intersected by the sawtooth signal. It will be assumed that the positive flanks of the pulse form signals of FIGS. 3b to 3b are to be differentiated by a monostable trigger circuit whose time constant is 113 ns. From the needle shaped pulses of FIG. 3b there is consequently produced at the output of the monostable trigger the pulse form signal of FIG. 3g. Similarly, from the signal of FIG. 3c the differentiated signal shown in FIG. 3h is produced, from the signal of 3d the signal of FIG. 3i is produced, from the signal of FIG. 3e the signal of FIG. 3k is produced, and from the signal of FIG. 3f the signal of FIG. 3l is produced. A comparison between the pulse form signal of FIG. 3g and the signal of FIG. 3l shows a phase displacement of 90° referred to the sinusoidal colour carrier oscillation of FIG. 3a. A similar phase displacement is also obtained in respect of the negative flanks of the pulse form signals of FIGS. 3b to 3f.

Figure 4:
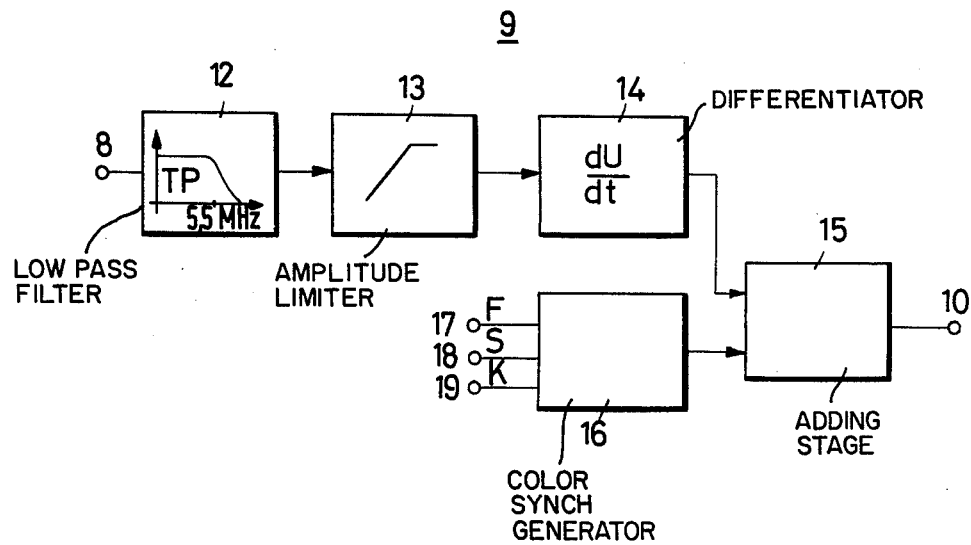
FIG. 4 illustrates in greater detail the portion 9 of FIG. 1.

Thus in the preferred form of the circuit 9, FIG. 4, these phase errors are avoided by applying the pulse form signals obtained at the output of the comparator 4 first to a low pass filter 12. The low pass filter 12 converts the pulse form signals into sinusoidal signals. The dashed lines shown in FIGS. 3b to 3f are intended to make clear the action of the low pass filter 12. It will be seen that the phase relationship of the sinusoidal signals available at the output of the low pass filter 12 does not vary during the different points of time 1 to 5. Only a change of amplitude occurs.

By means of an amplitude limiter 13 the sinusoidal signal available at the output of the low pass filter 12 is again converted into a pulse signal of rectangular shape. For this purpose the amplitude limiter is advantageously adjusted so that it effects the limitation at the zero transit point of the sinusoidal oscillation. By subsequent amplification (by means not shown) there is then obtained a pulse signal similar to FIG. 3l for each point of time when operating upon the sinusoidal oscillation. The signal then available at the output of the amplitude limiter 13 is differentiated in a known manner by means of the differentiating circuit 14 previously referred to.

In the present example the differentiating circuit 14 comprises two monostable triggers. One monostable trigger is triggered by the positive flanks of the signal at the output of the amplitude limiter, and the other trigger is triggered by the negative flanks. Each monostable trigger delivers output pulses having a width of 113 ns. The output pulses thus obtained are added in an adding circuit. FIG. 2c shows the signal thus obtained in the case of the pulse form signal of FIG. 2b, the positions of the differentiating peaks corresponding with the positions of the flanks in the pulse form signal of FIG. 2b.

To the differentiated signal of FIG. 2c used for brightness control of the picture tube, a synchronizing signal S is added in an adding stage 15, and the differentiated signal is then applied to the (F) BAS input of the monitor 11. This added synchronizing signal S is necessary if the monitor 11 cannot be synchronized by other signals.

For the purpose of colour representation of a colour video signal upon the picture screen of the monitor 11, where the latter is a colour monitor having an FBAS input, there is also added to the differentiated signal from 14 a colour synchronizing signal occurring in the horizontal blanking intervals, and the differentiated signal with added colour synchronzing signal is then applied to the FBAS input of the colour monitor. The colour synchronizing signal is generated in a stage 16. In dependence upon a colour carrier signal F delivered at terminal 17, the synchronizing signal S delivered at terminal 18, and an identification pulse signal K delivered at the terminal 19, the stage 16 delivers a colour synchronzing signal conforming with the appropriate standard. A colour carrier frequency colour bar signal for vertically arranged colour bars would show itself upon the picture screen of the colour monitor as a flight of steps which, in the region of the colour carrier oscillations situated at the individual steps, is coloured in accordance with the particular coded colour carrier information.

In the case where horizontal lines are to be represented upon the picture screen of the monitor 11, a high frequency signal is superimposed upon the vertical frequency sawtooth signal V generated by the sawtooth generator 2. This high frequency signal must be added because the differentiation of a horizontal function with a differentiating circuit cannot deliver a pulse form signal for brightness control of the picture reproduction tube. Alternatively, the high frequency signal can be added to the signal at the terminal 6 which is to be represented on the screen. The important factor is that the signal available at the output terminal 8 of the comparator 4 must be chopped into pulse form in order that the following differentiating circuit can be effective. The addition of the high frequency component can be effected by well known circuitry which it is not deemed necessary to describe further.

Where it is desired to effect the simultaneous representation of a plurality of voltage curves on the monitor - as is the case in the prior art described in German Patent Specification 12 52 797 — additional comparators 4 may be used, one for each signal to be represented, each comparator 4 being fed with a vertical sawtooth signal and having a respective circuit 9 associated therewith, the outputs 10 of the circuits 9 being added together and fed to a common monitor 11. In this way it is possible to represent level lines and/or signal patterns upon the picture screen which can be employed for making comparative measurements. For example, for the exact adjustment of saturation in colour monitors, a chrominance signal for the blue colour component can be indicated as a level oscillogram.

Moreover, by displacing the picture raster it is also possible to reproduce upon the picture screen of the monitor parts of the signal to be represented which, in the normal way would be blanked by the monitor. Such portions of the signal are, for example, the synchronizing pulses and the colour synchronizing signals in the horizontal blanking interval.

Figure 5:
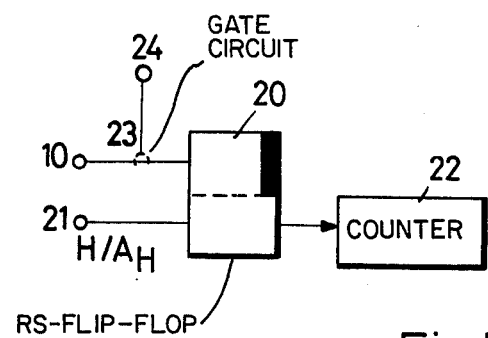
FIG. 5 is a block schematic diagram of a circuit for digital level evaluation.

In addition to the subjective comparative measurement of amplitudes in the represented signal by the use of superimposed level lines, it is also possible to achieve a digital indication of the individual amplitude values in the represented signal. In such a case one starts upon the assumption that the signal to be represented already exists in a quasi-digitalized form. The pulse signal at terminal 10 (FIG. 1) is to be regarded as particularly suitable for amplitude measurements. As shown in FIG. 5 the pulse signal for brightness control available at terminal 10 is delivered to one input of an R-S flip flop 20. The other input of the R-S flip flop 20 is connected to a terminal 21 to which is supplied either a horizontal pulse signal H or a horizontal frequency blanking signal $A_H$.

The output of the R-S flip flop 20 is connected to a counter 22, which controls a digital indication device (not shown). For the amplitude measurement at determined instants of time in the represented signal, a gate circuit 23 is provided in the lead from the terminal 10 to the R-S flip flop 20, to which gate a pulse signal is delivered at terminal 24, this pulse signal being variable in width and position with reference to a television line. The amplitude measurement according to FIG. 5 is distinguished from the known subjective types of amplitude measurement in that in this case the amplitude measurement is reduced to the counting of pulses.

While the invention has been particularly shown and described with reference to the preferred embodiment thereof, it will be understood by those skilled in the art that various changes in form and details may be made therein without departing from the spirit and scope of the invention.

We claim:

1. A circuit arrangement for visually representing a horizontal frequency coupled input signal upon the picture screen of a video display device, comprising means for generating a vertical frequency sawtooth signal, means for comparing the input signal with the sawtooth signal so as to produce as output a further signal identifying the moments when the input and sawtooth signals are equal, and a video display device coupled to the output of the comparing means in such manner that the brightness of the picture screen of the display device is controlled by the further signal.

2. A circuit arrangement according to claim 1, further comprising means for adjustable voltage division of the sawtooth signal prior to comparison with the input signal.

3. A circuit arrangement according to claim 1, further comprising means for adding an adjustable unidirectional voltage to the input signal prior to comparison with the sawtooth signal.

4. A circuit arrangement for simultaneously visually representing a plurality of input signals, comprising the combination of a plurality of arrangements according to claim 1 having a common display device.

5. A circuit arrangement according to claim 1, further comprising means for clamping the input signal prior to comparison with the sawtooth signal.

6. A circuit arrangement according to claim 5, in which the clamping level of the input signal is adjustable.

7. A circuit arrangement according to claim 1, in which the further signal has a first value when the input signal is greater than the sawtooth signal and a second value when the input signal is less than the sawtooth signal the arrangement further comprising means connected between the output of the comparing means and the display device for differentiating the further signal.

8. A circuit arrangement according to claim 7, further comprising means for superimposing a high frequency component on one of the input and sawtooth signals.

9. A circuit arrangement according to claim 7, further comprising means for adding a synchronizing signal for the display device to the signal from the differentiating means.

10. A circuit arrangement according to claim 7, in which the video display device is a colour display device, the arrangement further including means for adding a colour synchronizing signal for the display device to the signal from the differentiating means.

11. A circuit arrangement according to claim 7, further comprising an amplitude measuring circuit connected in parallel with the video display device to receive the signal from the differentiating means the amplitude measuring circuit comprising an R-S flip flop having a first input connected to receive the signal from the differentiating means and a second input connected to receive a horizontal frequency signal, and a digital counter connected to the output of the flip flop.

12. A circuit arrangement according to claim 7, further comprising a low pass filter and an amplitude limiter connected in that order between the output of the comparing means and the differentiating means.

13. A circuit arrangement according to claim 12, in which the differentiating means comprises two monostable trigger circuits, one trigger circuit being triggered by the positive flanks of the signal from the amplitude limiter and the other trigger circuit being triggered by the negative flanks of the signal from the amplitude limiter, and means for adding together the outputs of the two trigger circuits.

* * * * *